(12) United States Patent
Kamiyama

(10) Patent No.: US 11,515,253 B2
(45) Date of Patent: Nov. 29, 2022

(54) ELECTRONIC MODULE

(71) Applicant: SHINDENGEN ELECTRIC MANUFACTURING CO., LTD., Chiyoda-ku (JP)

(72) Inventor: Yoshihiro Kamiyama, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 818 days.

(21) Appl. No.: 16/081,599

(22) PCT Filed: Jan. 26, 2018

(86) PCT No.: PCT/JP2018/002481
§ 371 (c)(1),
(2) Date: Aug. 31, 2018

(87) PCT Pub. No.: WO2019/146073
PCT Pub. Date: Aug. 1, 2019

(65) Prior Publication Data
US 2021/0050293 A1    Feb. 18, 2021

(51) Int. Cl.
*H05K 1/18* (2006.01)
*H05K 7/20* (2006.01)
(Continued)

(52) U.S. Cl.
CPC .......... *H01L 23/5286* (2013.01); *H02K 11/33* (2016.01); *H02P 27/06* (2013.01); *H03K 17/08142* (2013.01); *H03K 17/162* (2013.01)

(58) Field of Classification Search
CPC .......... H05K 1/18; H05K 1/0228; H05K 5/22; H05K 5/225; H05K 7/20; H05K 11/00;
(Continued)

(56) References Cited

U.S. PATENT DOCUMENTS

| 5,375,429 A * | 12/1994 | Tokizaki | F24F 1/0003 62/235.1 |
| 2002/0118560 A1* | 8/2002 | Ahmed | H01L 23/66 363/144 |

(Continued)

FOREIGN PATENT DOCUMENTS

| JP | 7-226480 A | 8/1995 |
| JP | 2012-5301 A | 1/2012 |

(Continued)

OTHER PUBLICATIONS

Chinese Office Action dated Sep. 11, 2020 in Chinese Patent Application No. 201880000925.2 (with English translation), 22 pages.

(Continued)

*Primary Examiner* — Xiaoliang Chen
(74) *Attorney, Agent, or Firm* — Oblon, McClelland, Maier & Neustadt, L.L.P.

(57) ABSTRACT

An electronic module includes a power supply wiring line disposed on a substrate along a first side and connected to a power supply terminal, a ground wiring line disposed on the substrate along a second side and connected to a ground terminal, and first to third half bridges each having a high-side switch and a low-side switch connected in series between the power supply wiring line and the ground wiring line. Connection points of the high-side switches and the low-side switches are connected to first to third motor terminals and also connected in parallel to one another. The first motor terminal, the second motor terminal, and the third motor terminal are disposed between the power supply terminal and the ground terminal.

13 Claims, 3 Drawing Sheets

(51) Int. Cl.
  *H05K 11/00* (2006.01)
  *H02M 7/00* (2006.01)
  *H02M 7/483* (2007.01)
  *H02M 7/537* (2006.01)
  *H02M 7/5387* (2007.01)
  *H02M 1/00* (2006.01)
  *H01L 23/50* (2006.01)
  *H01L 23/495* (2006.01)
  *H01L 23/498* (2006.01)
  *H01L 23/522* (2006.01)
  *H01L 23/528* (2006.01)
  *B62D 5/04* (2006.01)
  *H02K 11/33* (2016.01)
  *H02P 27/06* (2006.01)
  *H03K 17/0814* (2006.01)
  *H03K 17/16* (2006.01)

(58) Field of Classification Search
  CPC ......... H05K 11/27; H05K 11/33; H02M 7/00;
    H02M 7/003; H02M 7/483; H02M 7/537;
    H02M 7/5387; H02M 1/00; H01L 23/50;
    H01L 23/495; H01L 23/498; H01L
    23/522; H01L 23/528; B62D 5/04
  USPC .................. 361/777, 90, 605, 710; 180/444;
    318/400.26, 400.32, 490; 363/1, 15, 68,
    363/132, 146, 163, 605; 310/68 D, 68 R,
    310/91
  See application file for complete search history.

(56) References Cited

U.S. PATENT DOCUMENTS

| | | | | |
|---|---|---|---|---|
| 2005/0152100 A1* | 7/2005 | Rodriguez | ............ | H02M 7/003 361/605 |
| 2005/0152101 A1* | 7/2005 | Rodriguez | ......... | H05K 7/20272 361/605 |
| 2005/0162875 A1* | 7/2005 | Rodriguez | ............ | H05K 7/1432 363/68 |
| 2005/0269895 A1* | 12/2005 | Innami | ................. | B62D 5/0403 310/429 |
| 2006/0006749 A1* | 1/2006 | Sasaki | .................... | H02K 11/33 310/68 R |
| 2006/0007721 A1* | 1/2006 | Rodriguez | ............ | H02M 7/003 363/146 |
| 2006/0198072 A1* | 9/2006 | Inaba | ............... | H03K 19/00376 361/90 |
| 2006/0232942 A1* | 10/2006 | Nakatsu | .................. | B60L 50/16 361/710 |
| 2007/0063661 A1* | 3/2007 | Galli | ........................ | H02P 3/22 318/109 |
| 2007/0189048 A1* | 8/2007 | Goto | .................. | B60H 1/00428 363/95 |
| 2007/0222330 A1* | 9/2007 | Innami | ................... | H02K 11/33 310/89 |
| 2008/0115512 A1* | 5/2008 | Rizzo | ................. | B60H 1/00428 62/134 |
| 2008/0203962 A1* | 8/2008 | Maeda | ..................... | H02P 25/03 318/721 |
| 2008/0211563 A1* | 9/2008 | Inaba | .................... | H03K 19/018 327/333 |
| 2009/0039729 A1* | 2/2009 | Innami | ................... | H02K 11/33 310/254.1 |
| 2009/0258282 A1* | 10/2009 | Harada | ............... | H01M 10/613 429/61 |
| 2010/0052449 A1* | 3/2010 | Hashimoto | .......... | B62D 5/0406 310/91 |
| 2010/0116570 A1* | 5/2010 | Sugawara | ............... | B60L 58/26 180/65.1 |
| 2010/0248008 A1* | 9/2010 | Sugawara | ............. | H01M 50/20 429/159 |
| 2011/0018485 A1* | 1/2011 | Maeda | .................... | H02P 6/153 318/721 |
| 2012/0001227 A1 | 1/2012 | Takahashi et al. | | |
| 2012/0034507 A1* | 2/2012 | Harada | ............... | H01M 10/613 429/120 |
| 2012/0098366 A1* | 4/2012 | Yamasaki | ............... | H02K 5/225 310/72 |
| 2012/0098391 A1* | 4/2012 | Yamasaki | ............... | H02K 11/33 310/68 D |
| 2014/0159481 A1* | 6/2014 | Berger | ................ | H02M 7/5387 307/10.1 |
| 2016/0072423 A1* | 3/2016 | Kanazawa | .............. | H02P 27/06 180/444 |
| 2016/0126882 A1* | 5/2016 | Nakao | ....................... | H02K 5/22 318/490 |
| 2016/0134214 A1* | 5/2016 | Nakao | ................... | B60L 15/025 318/400.32 |
| 2016/0268951 A1* | 9/2016 | Cho | ....................... | H02M 7/483 |
| 2016/0351488 A1* | 12/2016 | Kamiyama | ........ | H01L 23/49811 |
| 2016/0359372 A1* | 12/2016 | Lee | ........................ | H04W 4/80 |
| 2017/0373629 A1* | 12/2017 | Shin | ......................... | H02P 21/22 |
| 2018/0054089 A1* | 2/2018 | Lee | ......................... | H02J 50/10 |
| 2018/0067148 A1* | 3/2018 | Tsuchida | ................ | G01R 19/18 |
| 2018/0123495 A1* | 5/2018 | Baurle | .................... | H03K 17/08 |
| 2018/0159442 A1* | 6/2018 | Newton | ............. | H02M 7/53871 |
| 2018/0201302 A1* | 7/2018 | Sonoda | ................... | B62D 5/046 |
| 2018/0277513 A1* | 9/2018 | Macheiner | ........ | H01L 23/49805 |
| 2018/0331647 A1* | 11/2018 | Matsuzaki | .............. | H02M 1/08 |
| 2019/0214928 A1* | 7/2019 | Ghaderi | ................... | H02P 21/22 |
| 2019/0260209 A1* | 8/2019 | Nishikawa | ................ | H02J 7/00 |
| 2019/0319572 A1* | 10/2019 | Okanoue | .......... | H02M 7/53875 |
| 2020/0067435 A1* | 2/2020 | Nishimiya | ................ | H02P 6/24 |

FOREIGN PATENT DOCUMENTS

| | | |
|---|---|---|
| JP | 2015-20368 A | 2/2015 |
| JP | 2016-144365 A | 8/2016 |
| JP | 2016-197985 A | 11/2016 |
| WO | WO 2016/194033 A1 | 12/2016 |

OTHER PUBLICATIONS

International Search Report dated Apr. 3, 2018, in PCT/JP2018/002481 filed Jan. 26, 2018 (with English Translation of Categories of Cited Documents in attached foreign language Search Report)
Japanese Office Action dated Jun. 25, 2019 in Japanese Patent Application No. 2018-535076 (with Engiish translation), citing documents AO and AP therein, 5 pages.

* cited by examiner

ELECTRONIC MODULE

TECHNICAL FIELD

The present invention relates to electronic modules.

BACKGROUND ART

Conventionally known semiconductor devices include an electronic module configured to convert DC power inputted from a DC power supply to AC power and output the AC power.

The electronic module is used, for example, to convert a DC voltage to a three-phase AC voltage for driving a three-phase motor (for example, see JP 2016-197985 A and JP 2015-020368 A).

In such a conventional electronic module, a layout is divided into portions each representing a phase and including a current path from a power supply terminal to a ground terminal via a power supply wiring line, a half bridge having a high-side switch and a low-side switch, and a ground wiring line. Therefore, each phase has a different current path for a motor current (induced current).

In other words, the length of the current path for the motor current flowing through the power supply terminal, the power supply wiring line, the half bridge having the high-side switch and the low-side switch, the ground wiring line, and the ground terminal differs in each phase.

The differences in the length of the current path for the motor current in the respective phases may cause differences in value of impedance and inductance in the current paths of the respective phases of the three-phase motor included in the electronic module.

Therefore, a phase having a longer current path may have larger switching noise and surge voltage, which in turn increases the amount of heat generated in the current path. This may shorten the life of the switches in the half bridge.

DISCLOSURE OF THE INVENTION

Problem to be Solved by the Invention

Under the circumstance, an object of the present invention is to provide an electronic module capable of reducing the switching noise and the surge voltage to reduce the amount of the generated heat, thereby elongating the life of the switches included in the half bridges.

Solution to Problem

An electronic module according to an embodiment in as aspect of the present invention is an electronic module configured to convert a direct current to a three-phase alternating current, and supply the three-phase alternating current to a three-phase motor to drive the three-phase motor, the electronic module including:

a substrate;

a plurality of signal terminals arranged along a first side of the substrate;

a power supply terminal, a first motor terminal, a second motor terminal, and a third motor terminal connected to three coils of the three-phase motor respectively, and a ground terminal, arranged along a second side that is opposite to the first side of the substrate;

a power supply wiring line disposed on the substrate along the first side, the power supply wiring line being connected to the power supply terminal;

a ground wiring line disposed along the second side on the substrate and connected to the ground terminal; and first to third half bridges each including a high-side switch and a low-side switch connected in series between the power supply wiring line and the ground wiring line, connection points between the high-side switches and the low-side switches being connected to the first to third motor terminals, and connected in parallel with one another, wherein the first motor terminal, the second motor terminal, and the third motor terminal are disposed between the power supply terminal and the ground terminal.

In the electronic module, a first length of a first current path from the power supply terminal to the ground terminal via the first motor terminal, a second length of a second current path from the power supply terminal to the ground terminal via the second motor terminal, and a third length of a third current path from the power supply terminal to the ground terminal via the third motor terminal are set to reduce differences in inductance and impedance.

In the electronic module, the power supply wiring line includes:

a first portion disposed on a top surface of the substrate and extending along the first side of the substrate; and a second portion extending along a third side that intersects the first side and the second side of the substrate, the second portion having one end that is connected to one end of the first portion and another end that is connected to another end of the power supply terminal.

In the electronic module, the first half bridge includes:

a first high-side switch disposed on another end of the first portion, the first high-side switch having one end that is connected to the first portion and another end that is connected to the first motor terminal; and a first low-side switch having one end that is connected to the first motor terminal and another end that is connected to the ground wiring line, the third half bridge includes:

a third high-side switch disposed on the one end of the first portion, the third high-side switch having one end that is connected to the first portion and another end that is connected to the third motor terminal; and a third low-side switch having one end that is connected to the third motor terminal and another end that is connected to the ground wiring line, and the second half bridge includes:

a second high-side switch disposed on the first portion between the first high-side switch and the third high-side switch, the second high-side switch having one end that is connected to the first portion and another end that is connected to the second motor terminal; and a second low-side switch having one end that is connected to the second motor terminal and another end that is connected to the ground wiring line.

In the electronic module, the power supply terminal, the first motor terminal, the second motor terminal, the third motor terminal, and the ground terminal are arranged from the third side in this order along the second side of the substrate.

The electronic module further includes:

a first central wiring line disposed on the top surface of the substrate between the first portion of the power supply wiring line and the ground wiring line, the first central wiring line being close to the first high-side switch and electrically connected to the other end of the first high-side switch and the first motor terminal;

a second central wiring line disposed on the top surface of the substrate between the first portion of the power supply wiring line and the ground wiring line, the second central wiring line being close to the second high-side switch and electrically connected to the other end of the second high-side switch and the second motor terminal; and a third central wiring line disposed on the top surface of the substrate between the first portion of the power supply wiring line and the ground wiring line, the third central wiring line being close to the third high-side switch and electrically connected to the other end of the third high-side switch and the third motor terminal.

The electronic module further includes:

t a first output wiring line disposed on the top surface of the substrate to be close to the first central wiring line;

a second output wiring line disposed on the top surface of the substrate to be close to the second central wiring line;

a third output wiring line disposed on the top surface of the substrate to be close to the third central wiring line;

a first output switch disposed on the first output wiring line, and having one end that is connected to the first output wiring line and another end that is connected to the first motor terminal;

a second output switch disposed on the second output wiring line, and having one end that is connected to the second output wiring line and another end that is connected to the second motor terminal; and a third output switch disposed on the third output wiring line, and having one end that is connected to the third output wiring line and another end that is connected to the third motor terminal.

In the electronic module, the ground wiring line includes:

a first ground wiring line disposed on the substrate along the second side; and a second ground wiring line disposed on the substrate between the first ground wiring line and a fourth side that intersects the first side and the second side and is opposite to the third side of the substrate, the second ground wiring line being connected to one end of the ground terminal, the electronic module further comprises a shunt resistor disposed to be close to the first side of the substrate, the shunt resistor having one end that is connected to one end of the first ground wiring line, and another end that id connected to another end of the second ground wiring line, and the signal terminals include a first current detection terminal electrically connected to the one end of the shunt resistor, and a second current detection terminal electrically connected to the other end of the shunt resistor.

The electronic module further includes:

a first current detection wiring line disposed on the substrate to be close to the first current detection terminal, the first current detection wiring line having one end that is connected to the first current detection terminal and another end that is connected to the one end of the shunt resistor; and a second current detection wiring line disposed on the substrate to be close to the second current detection terminal, the second current detection wiring line having one end that is connected to the second current detection terminal and another end that is connected to the other end of the shunt resistor.

In the electronic module, the first to third low-side switches and the first to third output switches are arranged in a first direction in which the first side extends.

The electronic module further includes:

a sealing member configured to seal the power supply wiring line, the ground wiring line, the first to third half bridges, and the shunt resistor at least on the substrate.

In the electronic module, the first to third high-side switches, the first to third low-side switches, and the first to third output switches are MOSFETs, each having a gate terminal to which any of the signal terminals is connected.

In the electronic module, the first direction along which the first side extends is perpendicular to a second direction along which the third side extends, and the substrate has a rectangular shape, of which a length of the first side and a length of second side is the same, a length of the third side and a length of a fourth side that is opposite to the third side is the same, and the first side is longer than the third side.

The electronic module further includes a first capacitor disposed on the substrate between the second central wiring line and the third central wiring line, the first capacitor having one end that is connected to the first portion of the power supply wiring line, and another end that is connected to the ground wiring line.

The electronic module further includes:

a second capacitor disposed on the substrate between the first central wiring line and the second central wiring line, the second capacitor having one end that is connected to the first portion of the power supply wiring line;

a connection wiring line disposed on the top surface of the substrate between the first output wiring line and the first central wiring line, the connection wiring line being connected to another end of the second capacitor; and a resistor having one end that is connected to the connection wiring line and another end that is connected to the ground wiring line.

Effects of the Invention

An electronic module in an aspect of the present invention is an electronic module configured to convert a direct current to a three-phase alternating current, and supply the three-phase alternating current to a three-phase motor to drive the three-phase motor, the electronic module including:

a substrate;

a plurality of signal terminals arranged along a first side of the substrate;

a power supply terminal, a first motor terminal, a second motor terminal, and a third motor terminal connected to three coils of the three-phase motor respectively, and a ground terminal, arranged along a second side that is opposite to the first side of the substrate;

a power supply wiring line disposed on the substrate along the first side, the power supply wiring line being connected to the power supply terminal;

a ground wiring line disposed along the second side on the substrate and connected to the ground terminal; and first to third half bridges each including a high-side switch and a low-side switch connected in series between the power supply wiring line and the ground wiring line, connection points between the high-side switches and the low-side switches being connected to the first to third motor terminals, and connected in parallel with one another.

The first motor terminal, the second motor terminal, and the third motor terminal are disposed between the power supply terminal and the ground terminal.

Thus, in an electronic module in an aspect of the present invention, the signal terminals are disposed on the first side of the substrate, the power supply terminal, the ground terminal, and the motor terminals are disposed on the second side of the substrate in a manner that the first motor terminal, the second motor terminal, and the third motor terminal are arranged between the power supply terminal and the ground terminal, and the wiring lines and the switches are arranged on the substrate so that differences in the length among the current paths for the motor current from the power supply terminal to the ground terminal are reduced (in order words, differences in inductance and impedance among the phases of the three-phase motor are reduced). This reduces maximum values of switching noise and surge voltage, and in turn reduces the amount of the generated heat.

Thus, the electronic module according to the present invention may reduce the switching noise and the surge voltage to reduce the amount of generated heat, thereby elongating the life of the switches included in the half bridges.

EMBODIMENTS FOR CARRYING OUT THE INVENTION

Embodiments of the present invention will now be described with reference to the accompanying drawings.

First Embodiment

Figure 1:
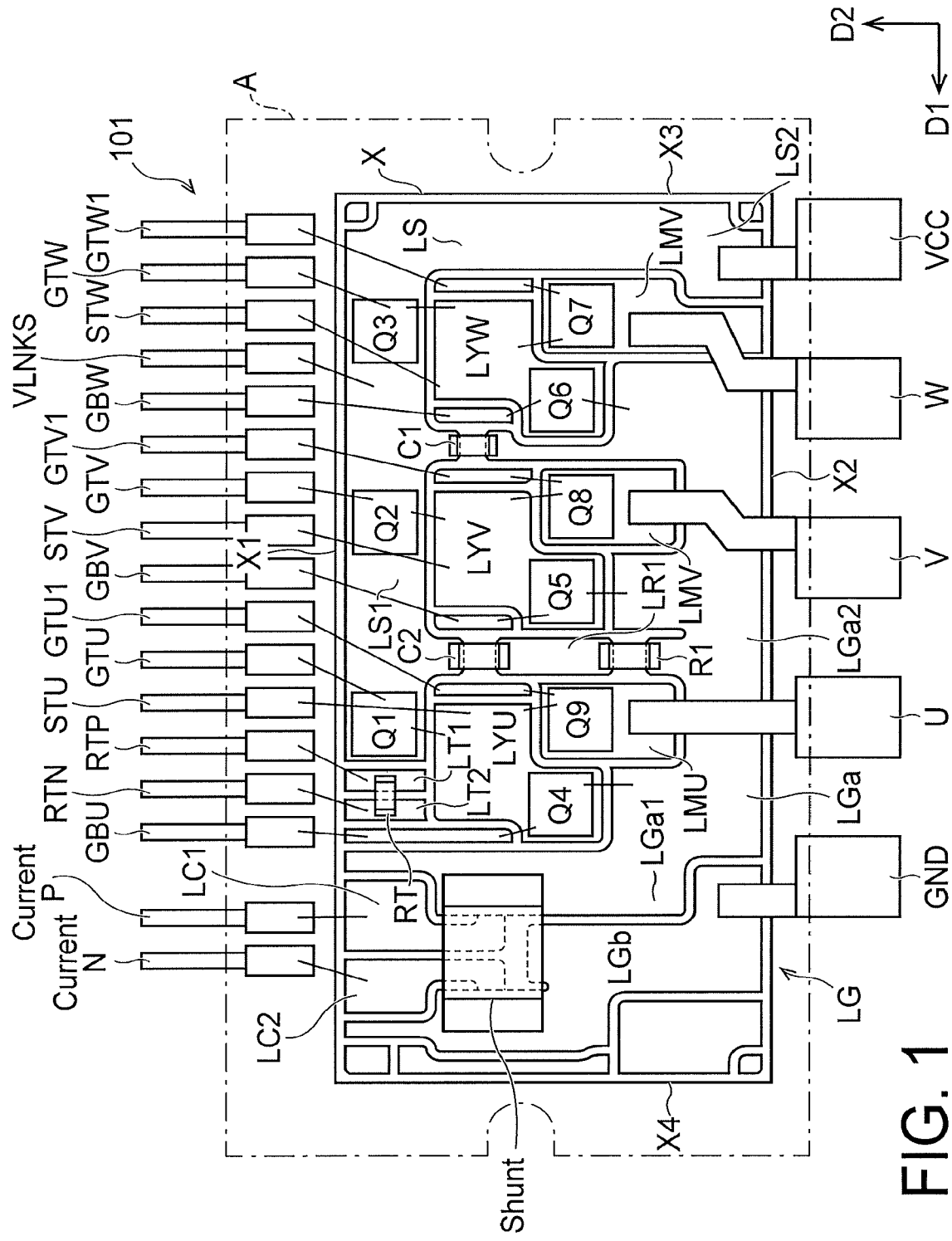
FIG. 1 is a top view of an example of a configuration of an electronic module 100 according to a first embodiment.
Figure 2:
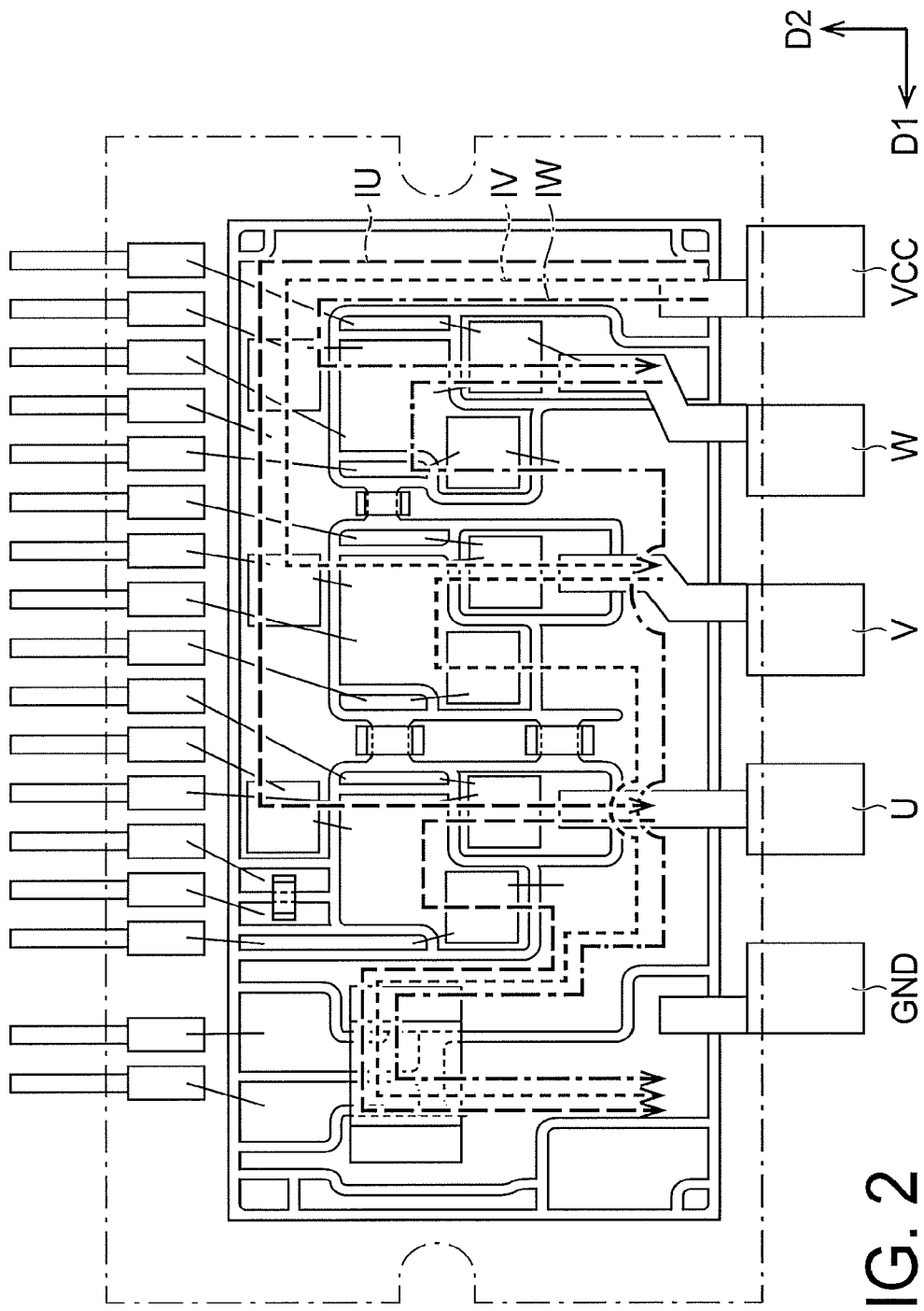
FIG. 2 is a diagram illustrating an example of current paths of the electronic module 100 shown in FIG. 1.
Figure 3:
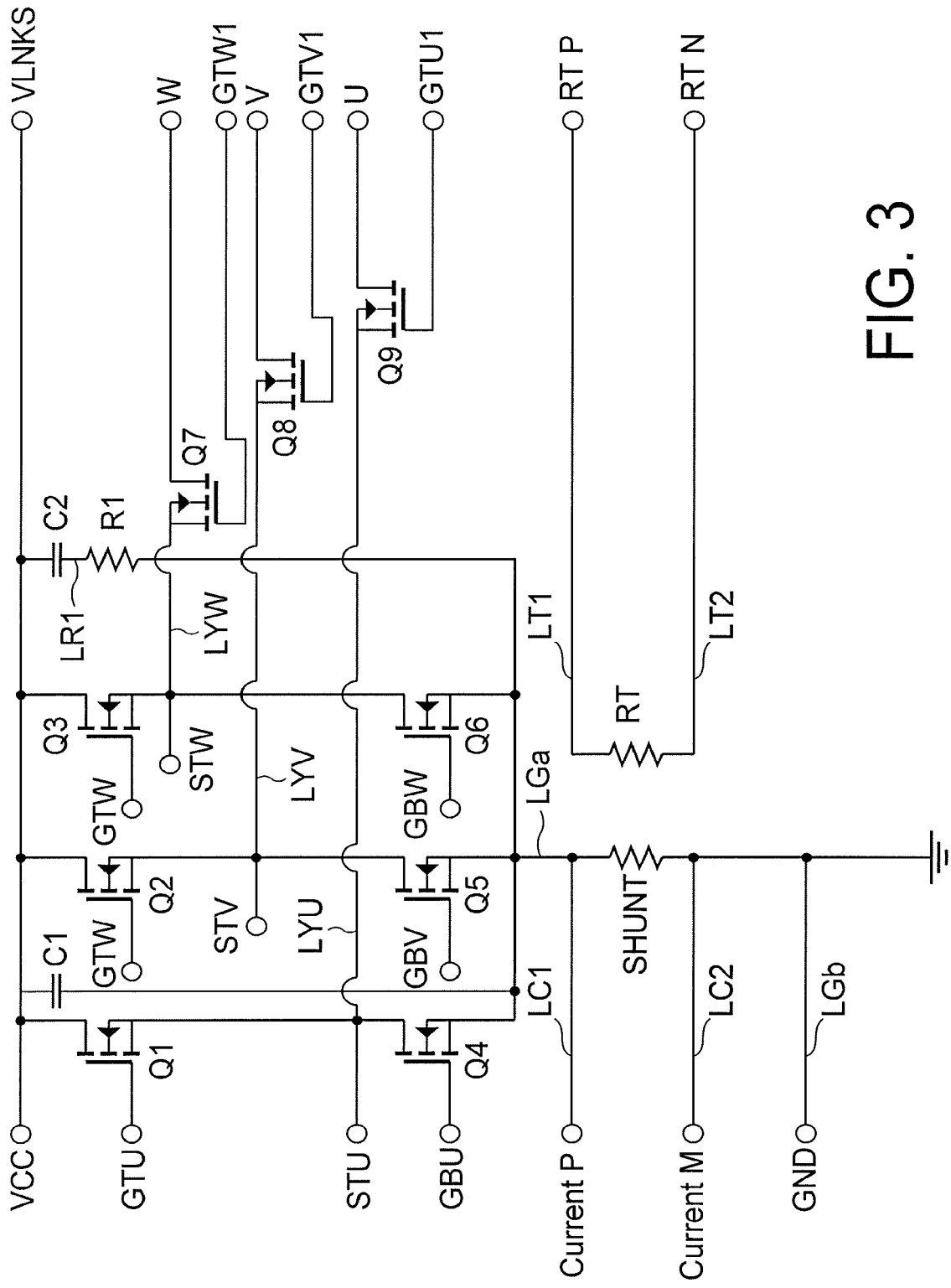
FIG. 3 is a circuit diagram of the example of the circuit configuration of the electronic module 100 shown in FIG. 1.

FIG. 1 is a top view of an example of a configuration of an electronic module 100 according to a first embodiment. FIG. 2 is a diagram illustrating an example of current paths of the electronic module 100 shown in FIG. 1. FIG. 3 is a circuit diagram of an example of a circuit configuration of the electronic module 100 shown in FIG. 1. In FIGS. 1 and 2, a sealing member A is illustrated to be transparent. In FIG. 2, some of the reference numerals provided in FIG. 1 are omitted for simplicity.

For example, the electronic module 100 according to the first embodiment is an inverter device configured to convert a direct current to a three-phase alternating current, and supply the three-phase alternating current to a three-phase motor to drive the three-phase motor.

As shown in FIGS. 1 to 3, the electronic module 100 includes a substrate X, a plurality of signal terminals 101, a power supply wiring line LS, a ground wiring line LG, a power supply terminal VCC, first to third motor terminals U, V, and W, a ground terminal GND, a first half bridge (Q1, Q4), a second half bridge (Q2, Q5), a third half bridge (Q3, Q6), a first output switch Q9, a second output switch Q8, a third output switch Q7, a first central wiring line LYU, a second central wiring line LYV, a third central wiring line LYW, a first output wiring line LMU, a second output wiring line LMV, a third output wiring line LMW, a connection wiring line LR1, a shunt resistor Shunt, a first current detection wiring line LC1, a second current detection wiring line LC2, a first capacitor C1, a second capacitor C2, a resistor R1, a thermistor RT, a first thermistor wiring line LT1, a second thermistor wiring line LT2, and a sealing member A.

The substrate X is, for example, an insulating substrate such as a ceramic substrate.

The substrate X has a rectangular shape. The length of a first side X1 of the substrate X and the length of a second side X2 that is opposite to the first side X1 are the same. The length of a third side X3 and the length of the fourth side X4 that is opposite to the third side X3 is the same in the substrate X. The first side X1 is longer than the third side X3 in the substrate X.

The first side X1 of the substrate X extends along a first direction D1, which is perpendicular to a second direction D2 along which the third side X3 of the substrate X extends.

The signal terminals 101 are arranged in the first direction D1, along the first side X1 of the substrate X.

s shown in FIGS. 1 and 3, the signal terminals 101 include signal terminals STU, STV, and STW, signal terminals GTU, GTV, and GTW for controlling first to third high-side switches Q1, Q2, and Q3, signal terminals GBU, GBV, and GBW for controlling first to third low-side switches Q4, Q5, and Q6, signal terminals GTU1, GTV1, and GTW1 for controlling the first to third output switches Q9, Q8, Q7, a signal terminal VLNKS electrically connected to the power supply wiring line LS, a first thermistor terminal RTP, a second thermistor terminal RTN, a first current detection terminal CurrentP, and a second current detection terminal CurrentN.

A DC power supply voltage is applied to the power supply terminal VCC.

The first to third motor terminals (U, V, W) are connected to three coils of the three-phase motor, respectively.

More specifically, the first motor terminal U is connected to a first phase (U phase) coil of the three-phase motor. The second motor terminal V is connected to a second phase (V phase) coil of the three-phase motor. The third motor terminal W is connected to a third phase (W phase) coil of the three-phase motor.

The ground terminal GND is grounded.

The power supply terminal VCC, the first to third motor terminals U, V, and W, and the ground terminal GND are arranged in the first direction D along the second side X2 that is opposite to the first side X1 of the substrate X, as shown in FIG. 1, for example.

The first motor terminal U, the second motor terminal V, and the third motor terminal W are disposed between the power supply terminal VCC and the ground terminal GND, as shown in particular in FIG. 1, for example.

The power supply terminal VCC, the first motor terminal U, the second motor terminal V, the third motor terminal W, and the ground terminal GND are arranged in this order from the third side X3 in the first direction D along the second side X2 of the substrate X.

As shown in FIG. 1, the power supply wiring line LS is arranged along the first side X1 of the substrate X and connected to the power supply terminal VCC.

The power supply wiring line LS has a first portion LS1 and a second portion LS2, as shown in FIG. 1, for example.

The first portion LS1 is disposed on the top surface of the substrate X and extends along the first side X1 of the substrate X.

The second portion LS2 extends along the third side X3 that intersects the first side X1 and the second side X2 of the substrate X. One end of the second portion LS2 is connected to one end of the first portion LS1, and the other end is connected to one end of the power supply terminal VCC.

As shown in FIG. 1, the ground wiring line LG is disposed on the substrate X along the second side X2, and connected to the ground terminal GND.

The ground wiring line LG includes, for example, a first ground wiring line LGa and a second ground wiring line LGb, as shown in FIG. 1.

The first ground wiring line LGa is disposed on the substrate X along the second side X2 in the first direction D1.

The second ground wiring line LGb is disposed on the substrate X so as to intersect the first side X1 and the second side X2 of the substrate X and be located between the fourth side X4 that is opposite to the third side X3 and the first ground wiring line LGa. The second ground wiring line LGb is connected to one end of the ground terminal GND.

As shown in FIG. 1, the first to third half bridges (Q1, Q4), (Q2, Q5), (Q3, Q6) are disposed between the power supply wiring line LS (first portion LS1) and the ground wiring line LG (first ground wiring line LGa) in a manner that the high-side switch Q1 and the low-side switch Q4 are connected in series, the high-side switch Q2 and the low-side switch Q5 are connected in series, and the high-side switch Q3 and the low-side switch Q6 are connected in series.

Furthermore, the first to third half bridges (Q1, Q4), (Q2, Q5), (Q3, Q6) are connected in a manner that the connection point between the high-side switch Q1 and the low-side switch Q4, the connection point between the high-side switch Q2 and the low-side switch Q5, and the connection point between the high-side switch Q3 and the low-side switch Q6 are connected to the first to third motor terminals U, V, and W, respectively, and also connected in parallel to one another.

More specifically, the first half bridge (Q1, Q4) includes the first high-side switch Q1 and the first low-side switch Q4, as shown in, for example, FIGS. 1 and 3.

The first high-side switch Q1 is disposed on the other end of the first portion LS1 of the power supply wiring line LS. One end of the first high-side switch Q1 is connected to the first portion LS1, and the other end is connected to the first motor terminal U.

One end of the first low-side switch Q4 is connected to the first motor terminal U via the first output switch Q9, and the other end is connected to the ground wiring line LG (first ground wiring line LGa).

The third half bridge (Q3, Q6) includes the third high-side switch Q3 and the third low-side switch Q6, as shown in, for example, FIGS. 1 and 3.

The third high-side switch Q3 is disposed on the one end of the first portion LS1 of the power supply wiring line LS. One end of the third high-side switch Q3 is connected to the first portion LS1, and the other end is connected to the third motor terminal W via the third output switch Q7.

One end of the third low-side switch Q6 is connected to the third motor terminal W via the third output switch Q7, and the other end is connected to the ground wiring line LG (first ground wiring line LGa).

The second half bridge includes the second high-side switch Q2 and the second low-side switch Q5, as shown in, for example, FIGS. 1 and 3.

The second high-side switch Q2 is disposed on the first portion LS1 between the first high-side switch Q1 and the third high-side switch Q3. One end of the second high-side switch Q2 is connected to the first portion LS1, and the other end is connected to the second motor terminal V via the second output switch Q8.

One end of the second low-side switch Q5 is connected to the second motor terminal V via the second output switch Q8, and the other end is connected to the first ground wiring line LGa.

The first central wiring line LYU is disposed on the top surface of the substrate X between the first portion LS1 of the power supply wiring line LS and the first ground wiring line LGa, as shown in FIG. 1 for example.

The first central wiring line LYU is disposed to be close to the first high-side switch Q1, and electrically connected to the other end of the first high-side switch Q1 and the first motor terminal U.

The first low-side switch Q4 is disposed on the first central wiring line LYU. The one end of the first low-side switch Q4 is connected to the first central wiring line LYU.

The second central wiring line LYV is disposed on the top surface of the substrate X between the first portion LS1 of the power supply wiring line LS and the first ground wiring line LGa, as shown in FIG. 1 for example.

The second central wiring line LYV is disposed to be close to the second high-side switch Q2, and electrically connected to the other end of the second high-side switch Q2 and the second motor terminal V.

The second low-side switch Q5 is disposed on the second central wiring line LYV. The one end of the second low-side switch Q5 is connected to the second central wiring line LYV.

The third central wiring line LYW is disposed on the top surface of the substrate X between the first portion LS1 of the power supply wiring line LS and the first ground wiring line LGa, as shown in FIG. 1 for example.

The third central wiring line LYW is disposed to be close to the third high-side switch Q3, and electrically connected to the other end of the third high-side switch Q3 and the third motor terminal W.

The third low-side switch Q6 is disposed on the third central wiring line LYW. The one end of the third low-side switch Q6 is connected to the third central wiring line LYW.

The first output wiring line LMU is disposed on the top surface of the substrate X so as to be close to the first central wiring line LYU, as shown in FIG. 1 for example.

The second output wiring line LMV is disposed on the top surface of the substrate X so as to be close to the second central wiring line LYV, as shown in FIG. 1 for example.

The third output wiring line LMW is disposed on the top surface of the substrate X so as to be close to the third central wiring line LMW, as shown in FIG. 1 for example.

The first output switch Q9 is disposed on the first output wiring line LMU, as shown in FIG. 1 for example. One end of the first output switch Q9 is connected to the first output wiring line LMU (signal terminal STU), and the other end is connected to the first motor terminal U, as shown in, for example, FIGS. 1 and 3.

The second output switch Q8 is disposed on the second output wiring line LMV, as shown in FIG. 1 for example. One end of the second output switch Q8 is connected to the second output wiring line LMV (signal terminal STV), and the other end is connected to the second motor terminal V, as shown in, for example, FIGS. 1 and 3.

The third output switch Q7 is disposed on the third output wiring line LMW, as shown in FIG. 1 for example. One end of the third output switch Q7 is connected to the third output wiring line LMW (signal terminal STW), and the other end is connected to the third motor terminal W, as shown in, for example, FIGS. 1 and 3.

The first to third low-side switches Q4, Q5, and Q6, and the first to third output switches Q9, Q8, and Q7 are arranged in the first direction D1 along which the first side X1 extends, as shown in FIG. 1 for example.

As shown in FIG. 3 for example, the first to third high-side switches Q1, Q2, and Q3, the first to third low-side switches Q4, Q5, and Q6, and the first to third output switches Q9, Q8, and Q7 are MOSFETs. One of the signal terminals 101 is connected to a gate terminal of one of these MOSFETs.

Specifically, the gate terminals of the first to third high-side switches Q1, Q2, and Q3, which are control terminals, are connected to the signal terminals GTU, GTV, and GTW, respectively (FIG. 3).

The gate terminals of the first to third low-side switches Q4, Q5, and Q6, which are control terminals, are connected to the signal terminals GBU, GBV, and GBW, respectively (FIG. 3).

The gate terminals of the first to third output switches Q9, Q8, and Q7, which are control terminals, are connected to the signal terminals GTU1, GTV1, and GTW1, respectively (FIG. 3).

The shunt resistor Shunt is disposed to be close to the first side X1 of the substrate X, as shown in FIG. 1 for example. One end of the shunt resistor Shunt is connected to one end LGa1 of the first ground wiring line LGa, and the other end is connected to the other end of the second ground wiring line LGb.

As described above, the signal terminals 101 include the first current detection terminal CurrentP and the second current detection terminal CurrentN.

The first current detection terminal CurrentP is electrically connected to the one end of the shunt resistor Shunt via the first current detection wiring line LC1.

The second current detection terminal CurrentN is electrically connected to the other end of the shunt resistor Shunt via the second current detection wiring line LC2.

The first current detection wiring line LC1 is disposed on the substrate X to be close to the first current detection terminal CurrentP, as shown in FIG. 1 for example. One end of the first current detection wiring line LC1 is connected to the first current detection terminal CurrentP, and the other end is connected to the one end of the shunt resistor Shunt.

The second current detection wiring line LC2 is disposed on the substrate X to be close to the second current detection terminal CurrentN, as shown in FIG. 1 for example. One end of the second current detection wiring line LC2 is connected to the second current detection terminal CurrentN, and the other end is connected to the other end of the shunt resistor Shunt.

The first capacitor C1 is disposed on the substrate X between the second central wiring line LYV and the third central wiring line LYW, as shown in FIG. 1 for example.

One end of the first capacitor C1 is connected to the first portion LS1 of the power supply wiring line LS, and the other end is connected to the ground wiring line LG (first ground wiring line LGa).

The second capacitor C2 is disposed on the substrate X between the first central wiring line LYU and the second central wiring line LYV, as shown in FIG. 1 for example.

One end of the second capacitor C2 is connected to the first portion LS1 of the power supply wiring line LS.

The connection wiring line LR1 is disposed on the top surface of the substrate X between the first output wiring line LMU and the first central wiring line LYV. The one end of the second capacitor C2 is connected to the connection wiring line LR1.

One end of the resistor R1 is connected to the connection wiring line LR1, and the other is connected to the ground wiring line LG (first ground wiring line LGa).

The thermistor RT for detecting the temperature is disposed on the substrate X to be close to the first side X1 of the substrate X between the other end of the first portion LS1 of the power supply wiring line LS and the first current detection wiring line LC1, as shown in FIG. 1 for example.

As described above, the signal terminals 101 include the first thermistor terminal RTP and the second thermistor terminal RTN.

The first thermistor terminal RTP is electrically connected to one end of the thermistor RT via the first thermistor wiring line LT1.

The second thermistor terminal RTN is electrically connected to the other end of the thermistor RT via the second thermistor wiring line LT2.

The first thermistor wiring line LT1 is disposed on the substrate X to be close to the first thermistor terminal RTP, as shown in FIG. 1 for example. One end of the first thermistor wiring line LT1 is connected to the first thermistor terminal RTP, and the other end is connected to the one end of the thermistor RT.

The second thermistor wiring line LT2 is disposed on the substrate X to be close to the second thermistor terminal RTN, as shown in FIG. 1 for example. One end of the second thermistor wiring line LT2 is connected to the second thermistor terminal RTN, and the other end is connected to the other end of the thermistor RT.

The sealing member A is formed of a sealing resin such as an epoxy resin.

The sealing member A seals the power supply wiring line LS, the ground wiring line LG, the first to third output wiring lines LMU, LMV, and LMW, the first to third central wiring lines LYU, LYV, and LYW, the first current detection wiring line LC1, the second current detection wiring line LC2, the connection wiring line LR1, the first thermistor wiring line LT1, the second thermistor wiring line LT2, the first capacitor C1, the second capacitor C2, the resistor R1, the first to third high-side switches Q1, Q2, and Q3, the first to third low-side switches Q4, Q5, and Q6, the first to third output switches Q9, Q8, and Q7, the thermistor RT, and the shunt resistor Shunt at least on the substrate X, as shown in FIG. 1 for example.

The sealing member A also seals one end of each of the signal terminals 101 along the first side X1 of the substrate X.

The sealing member A also seals one end of each of the power supply terminal VCC, the first motor terminal U, the second motor terminal V, the third motor terminal W, and the ground terminal GND along the first side X1 of the substrate X.

As shown in FIG. 2, for example, a first length of a first current path IW from the power supply terminal VCC to the ground terminal GND via the first motor terminal W, a second length of a second current path IV from the power supply terminal VCC to the ground terminal GND via the second motor terminal V, and a third length of a third current path IW from the power supply terminal VCC to the ground terminal GND via the third motor terminal W are set to reduce differences in inductance and impedance among the current paths IU, IV, and IW.

Specifically, the first length of the first current path IW, the second length of the second current path IV, and the third length of the third current path IW are set to approximate to (to be equal to) the same value.

Thus, in the electronic module 100, the signal terminals 101 are disposed on the first side X1 of the substrate X, the power supply terminal VCC, the ground terminal GND, and the motor terminals U, V, and W are disposed on the second side X2 of the substrate X in a manner that the first motor terminal U, the second motor terminal V, and the third motor terminal W are arranged between the power supply terminal VCC and the ground terminal GND, and the wiring lines and the switches are arranged on the substrate so that differences in the length among the current paths for the motor current from the power supply terminal VCC to the ground terminal VDD are reduced (in order words, differences in inductance and impedance among the phases of the three-phase motor are reduced). This reduces maximum values of switching noise and surge voltage, and in turn reduces the amount of the generated heat.

Thus, the electronic module 100 according to the first embodiment may reduce the switching noise and the surge voltage to reduce the amount of generated heat, thereby elongating the life of the switches included in the half bridges.

Second Embodiment

In the first embodiment described above, the first to third high-side switches Q1, Q2, and Q3, the first to third low-side switches Q3, Q5, and Q6, and the first to third output switches Q9, Q8, and Q7 are nMOSFET (FIG. 3). However, other types of semiconductor elements may also be used.

Specifically, the first to third high-side switches Q1, Q2, and Q3, the first to third low-side switches Q3, Q5, and Q6, and the first to third output switches Q9, Q8, and Q7 may be pMOSFETs or other semiconductor elements as long as the same function may be performed.

The configuration of the electronic module according to the second embodiment is the same as that of the first embodiment.

Thus, an electronic module in an aspect of the present invention is an electronic module configured to convert a direct current to a three-phase alternating current, and supply the three-phase alternating current to a three-phase motor to drive the three-phase motor, the electronic module including:

a substrate X;

a plurality of signal terminals arranged along a first side X1 of the substrate;

a power supply terminal VCC, a first motor terminal, a second motor terminal, and a third motor terminal (U, V, W) connected to coils of the three-phase motor respectively, and a ground terminal GND, arranged along a second side X2 that is opposite to the first side X1 of the substrate;

a power supply wiring line LS disposed on the substrate along the first side X1, the power supply wiring line being connected to the power supply terminal;

a ground wiring line LGa, LGb disposed along the second side X2 on the substrate X and connected to the ground terminal; and first to third half bridges (Q1, Q4), (Q2, Q5), (Q3, Q6) each including a high-side switch and a low-side switch connected in series between the power supply wiring line and the ground wiring line, connection points between the high-side switches and the low-side switches being connected to the first to third motor terminals, and connected in parallel with one another.

A first motor terminal U, a second motor terminal V, and a third motor terminal W are disposed between the power supply terminal VCC and the ground terminal GND.

Thus, in an electronic module in an aspect of the present invention, the signal terminals are disposed on the first side of the substrate, the power supply terminal, the ground terminal, and the motor terminals are disposed on the second side of the substrate in a manner that the first motor terminal, the second motor terminal, and the third motor terminal are arranged between the power supply terminal and the ground terminal, and the wiring lines and the switches are arranged on the substrate so that differences in the length among the current paths for the motor current from the power supply terminal to the ground terminal are reduced (in order words, differences in inductance and impedance among the phases of the three-phase motor are reduced). This reduces maximum values of switching noise and surge voltage, and in turn reduces the amount of the generated heat.

Thus, the electronic module according to the present invention may reduce the switching noise and the surge voltage to reduce the amount of generated heat, thereby elongating the life of the switches included in the half bridges.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: electronic module
X: substrate
101: signal terminals
LS: power supply wiring line
LG: ground wiring line
VCC: power supply terminal
U, V, W: first to third motor terminals
GND: ground terminal
Q1: first high-side switch
Q4: first low-side switch
Q2: second high-side switch
Q5: second low-side switch
Q3: third high-side switch
Q6: third low-side switch
Q9: first output switch
Q8: second output switch
Q7: third output switch
LYU: first central wiring line
LYV: second central wiring line
LYW: third central wiring line
LMU: first output wiring line
LMV: second output wiring line
LMW: third output wiring line
LR1: connection wiring line
Shunt: shunt resistor
LC1: first current detection wiring line
LC2: second current detection wiring line
C1: first capacitor
C2: second capacitor
R1: resistor
RT: thermistor
LT1: first thermistor wiring line
LT2: second thermistor wiring line
A: sealing member

The invention claimed is:

1. An electronic module configured to convert a direct current to a three-phase alternating current, and supply the three-phase alternating current to a three-phase motor to drive the three-phase motor, the electronic module comprising:
   a substrate;
   a plurality of signal terminals arranged along a first side of the substrate;
   a power supply terminal, a first motor terminal, a second motor terminal, and a third motor terminal connected to three coils of the three-phase motor respectively, and a ground terminal, arranged along a second side that is opposite to the first side of the substrate;
   a power supply wiring line disposed on the substrate along the first side, the power supply wiring line being connected to the power supply terminal;
   a ground wiring line disposed along the second side on the substrate and connected to the ground terminal; and
   first to third half bridges each including a high-side switch and a low-side switch connected in series between the power supply wiring line and the ground wiring line, connection points between the high-side switches and the low-side switches being connected to the first to third motor terminals, and connected in parallel with one another,
   wherein the first motor terminal, the second motor terminal, and the third motor terminal are disposed between the power supply terminal and the ground terminal,
   wherein a first length of a first current path from the power supply terminal to the ground terminal via the first motor terminal, a second length of a second current path from the power supply terminal to the ground terminal via the second motor terminal, and a third length of a third current path from the power supply terminal to the ground terminal via the third motor terminal are set to reduce differences in inductance and impedance,
   wherein the ground wiring line includes:
      a first ground wiring line disposed on the substrate along the second side, and
      a second around wiring line disposed on the substrate between the first ground wiring line and a fourth side that intersects the first side and the second side and is opposite to a third side of the substrate, the second ground wiring line being connected to one end of the ground terminal,
   wherein the electronic module further comprises a shunt resistor disposed to be close to the first side of the substrate, the shunt resistor having one end that is connected to one end of the first ground wiring line, and another end that is connected to another end of the second ground wiring line, and
   wherein the signal terminals include a first current detection terminal electrically connected to the one end of the shunt resistor, and a second current detection terminal electrically connected to the other end of the shunt resistor.

2. The electronic module according to claim 1, wherein the power supply wiring line includes:
   a first portion disposed on a top surface of the substrate and extending along the first side of the substrate; and
   a second portion extending along the third side that intersects the first side and the second side of the substrate, the second portion having one end that is connected to one end of the first portion and another end that is connected to another end of the power supply terminal.

3. The electronic module according to claim 2,
   wherein the first half bridge includes:
      a first high-side switch disposed on another end of the first portion, the first high-side switch having one end that is connected to the first portion and another end that is connected to the first motor terminal; and
      a first low-side switch having one end that is connected to the first motor terminal and another end that is connected to the ground wiring line,
   wherein the third half bridge includes:
      a third high-side switch disposed on the one end of the first portion, the third high-side switch having one end that is connected to the first portion and another end that is connected to the third motor terminal; and
      a third low-side switch having one end that is connected to the third motor terminal and another end that is connected to the ground wiring line, and
   wherein the second half bridge includes:
      a second high-side switch disposed on the first portion between the first high-side switch and the third high-side switch, the second high-side switch having one end that is connected to the first portion and another end that is connected to the second motor terminal; and
      a second low-side switch having one end that is connected to the second motor terminal and another end that is connected to the ground wiring line.

4. The electronic module according to claim 2, wherein the power supply terminal, the first motor terminal, the second motor terminal, the third motor terminal, and the ground terminal are arranged from the third side in this order along the second side of the substrate.

5. The electronic module according to claim 3, further comprising:
   a first central wiring line disposed on the top surface of the substrate between the first portion of the power supply wiring line and the ground wiring line, the first central wiring line being close to the first high-side switch and electrically connected to the other end of the first high-side switch and the first motor terminal;
   a second central wiring line disposed on the top surface of the substrate between the first portion of the power supply wiring line and the ground wiring line, the second central wiring line being close to the second high-side switch and electrically connected to the other end of the second high-side switch and the second motor terminal; and
   a third central wiring line disposed on the top surface of the substrate between the first portion of the power supply wiring line and the ground wiring line, the third central wiring line being close to the third high-side switch and electrically connected to the other end of the third high-side switch and the third motor terminal.

6. The electronic module according to claim 5, further comprising:
   a first output wiring line disposed on the top surface of the substrate to be close to the first central wiring line;
   a second output wiring line disposed on the top surface of the substrate to be close to the second central wiring line;
   a third output wiring line disposed on the top surface of the substrate to be close to the third central wiring line;

- a first output switch disposed on the first output wiring line, and having one end that is connected to the first output wiring line and another end that is connected to the first motor terminal;
- a second output switch disposed on the second output wiring line, and having one end that is connected to the second output wiring line and another end that is connected to the second motor terminal; and
- a third output switch disposed on the third output wiring line, and having one end that is connected to the third output wiring line and another end that is connected to the third motor terminal.

7. The electronic module according to claim 1, further comprising:
- a first current detection wiring line disposed on the substrate to be close to the first current detection terminal, the first current detection wiring line having one end that is connected to the first current detection terminal and another end that is connected to the one end of the shunt resistor; and
- a second current detection wiring line disposed on the substrate to be close to the second current detection terminal, the second current detection wiring line having one end that is connected to the second current detection terminal and another end that is connected to the other end of the shunt resistor.

8. The electronic module according to claim 6, wherein the first to third low-side switches and the first to third output switches are arranged in a first direction in which the first side extends.

9. The electronic module according to claim 1, further comprising a sealing member configured to seal the power supply wiring line, the ground wiring line, the first to third half bridges, and the shunt resistor at least on the substrate.

10. The electronic module according to claim 6, wherein the first to third high-side switches, the first to third low-side switches, and the first to third output switches are MOSFETs, each having a gate terminal to which any of the signal terminals is connected.

11. The electronic module according to claim 8,
- wherein the first direction along which the first side extends is perpendicular to a second direction along which the third side extends, and
- wherein the substrate has a rectangular shape, of which a length of the first side and a length of second side is the same, a length of the third side and a length of a fourth side that is opposite to the third side is the same, and the first side is longer than the third side.

12. The electronic module according to claim 6, further comprising a first capacitor disposed on the substrate between the second central wiring line and the third central wiring line, the first capacitor having one end that is connected to the first portion of the power supply wiring line, and another end that is connected to the ground wiring line.

13. The electronic module according to claim 12, further comprising:
- a second capacitor disposed on the substrate between the first central wiring line and the second central wiring line, the second capacitor having one end that is connected to the first portion of the power supply wiring line;
- a connection wiring line disposed on the top surface of the substrate between the first output wiring line and the first central wiring line, the connection wiring line being connected to another end of the second capacitor; and
- a resistor having one end that is connected to the connection wiring line and another end that is connected to the ground wiring line.

* * * * *